United States Patent [19]

Birkmaier et al.

[11] 4,422,907

[45] Dec. 27, 1983

[54] PRETREATMENT OF PLASTIC MATERIALS FOR METAL PLATING

[75] Inventors: Albert A. Birkmaier, Mendham; Gary A. Harpell, Morristown, both of N.J.; Bruce E. Kurtz, Marcellus, N.Y.; Gordhanbhai N. Patel, Camillus, N.Y.; Rustom P. Poncha, Syracuse, N.Y.; Adam L. Skovrinski, Memphis, N.Y.; James M. Lesco, Anaheim Hills, Calif.

[73] Assignee: Allied Corporation, Morris Township, Morris County, N.J.

[21] Appl. No.: 335,773

[22] Filed: Dec. 30, 1981

[51] Int. Cl.$^3$ .................... C25D 5/00; B05D 3/04
[52] U.S. Cl. .................... 204/38 B; 427/40; 427/306; 427/308
[58] Field of Search .................... 204/38 B, 129.1; 427/40, 304, 308, 444, 307, 306; 106/1.18, 1.23

[56] References Cited

U.S. PATENT DOCUMENTS

| | | | |
|---|---|---|---|
| 2,715,075 | 8/1955 | Wolinski | 117/47 |
| 2,715,076 | 8/1955 | Wolinski | 117/47 |
| 2,805,960 | 9/1957 | Wolinski | 117/38 |
| 3,227,605 | 1/1966 | Wolinski | 161/247 |
| 3,313,642 | 4/1967 | Waugh | 427/444 |
| 3,370,974 | 2/1968 | Hepfer | 427/307 |
| 3,437,507 | 4/1969 | Jensen | 427/307 |
| 3,686,018 | 8/1972 | Lindblom | 427/40 |
| 4,039,714 | 8/1977 | Roubal et al. | 428/336 |
| 4,165,394 | 8/1979 | Ehrbar | 427/40 |
| 4,337,279 | 6/1982 | Polak | 427/304 |

OTHER PUBLICATIONS

Goldie, William; *Metallic Coating of Plastics* vol. 1, Electrochemical Publications Limited; 26-27 (1968).
Maass, Walter; "Coating Metal by Glow Discharge" *Metal Finishing*, Jun. 1966, p. 110.
Publication–Jurgen Springer, Kirkor Sirinyan, Recai Sezi and Khuong ToVinh–Contributions to the Electroplating of Polymers, I. Effect of Chemical Pretreatment on Polymers of Styrene and Butadiene–Agnew. Makromol. Chem. 89, No. 1366, 81–89 (1980)–pp. 1–6.

*Primary Examiner*—G. Ozaki
*Assistant Examiner*—Gerard P. Rooney
*Attorney, Agent, or Firm*—Richard C. Stewart; Jay P. Friedenson

[57] ABSTRACT

This invention relates to a process for conditioning the surfaces of natural and synthetic plastic materials for electroless plating of a metal coating thereon by exposing such materials to an atmosphere comprising an effective amount of ozone and thereafter contacting said exposed materials with an effective amount of a conditioning solvent, such as an aqueous solution of sodium, potassium or lithium hydroxide.

23 Claims, No Drawings

PRETREATMENT OF PLASTIC MATERIALS FOR METAL PLATING

DESCRIPTION

BACKGROUND OF THE INVENTION

1. Field of the Invention

This invention relates to a process for the conditioning of plastic materials and plastic articles which are to be metal plated through use of conventional electroless and electro plating techniques. More particularly, this invention relates to an improved process for surface conditioning of such plastic materials and plastic articles so as to provide them with hydrophilic surfaces. This conditioning permits electroless and electroplating of said materials and articles to provide metal plated surfaces which possess increased peel strengths as compared to metal surfaces plated onto untreated surfaces. This invention also relates to products produced by the process of this invention.

2. Description of the Prior Art

In recent years, electroplating and metallic coating of plastics has become of ever increasing importance. In order to manufacture plastics having firmly bonded metal coatings, the plastic must be subjected to a pretreatment step, during which the surfaces of the plastic are treated to increase the peel strength and adhesion of metal surfaces coated thereon. Heretofore, various methods have been employed in such a pretreatment step. For example, in one such prior art method, the surfaces of the plastic are treated with a mixture of chromium trioxide, sulfuric acid and water, or a mixture of such ingredients and phosphoric acid. While relatively effective, this method suffers from a number of disadvantages. For example, the efficiency of this method is very much dependent on the type of plastic to be treated; and accordingly it is mainly confined to use in the pretreatment of a narrow class of plastics. Thus, the process does not have universal applicability for a wide range of assorted plastics.

Another disadvantage of this known method is that the relative amounts of components in the chromium trioxide containing pre-treatment solution must be maintained within a pre-determined and rather narrow range of concentrations. Only deviations of a few percent from these optimum amounts are permissible. Otherwise, on subsequent chemical deposition of the metal, the plastic surface is not completely coated by the metal and/or the entire coating does not possess sufficiently high peel strength. In addition, in this known method, the pretreatment solution becomes useless as soon as the concentration levels of the degradation products of the plastic and of the trivalent chromium compounds in the solution reach a certain level. Thus, constant analytical supervision and dosing of the chemicals consumed and monitoring of the degradation products produced during the conduct of this known pretreatment method is required. This continual control of the process considerably complicates its conduct.

Still another disadvantage of this known pretreatment process results from difficulties associated with the disposal of the used composition. To eliminate the used pretreatment composition, it is necessary to reduce the hexavalent chromium compounds and then to neutralize the reduction product. In the neutralization procedure, large amounts of highly voluminous chromium hydroxide are formed, the removal of which considerably encumbers the disposal of the used composition. Thus, the disposal of the used pretreatment composition also complicates the conduct of the process and requires considerable expenditures of time, capital, technical apparatus and plants.

Lastly, the pretreatment composition of this known process is very corrosive, and extensive washings with water are required to completely remove it from the plastic surface being pretreated. The result is a further increase in process time and expense.

Another prior art process for pretreating plastic surfaces to enhance the peel strength of metal surfaces electroless or electroplated thereon is disclosed in U.S. Pat. No. 4,039,714. In this process, the surfaces of the plastic to be electroplated is pretreated by exposing them to an atmosphere containing sulfur trioxide. This known pretreatment process also suffers from several inherent disadvantages. For example, sulfur trioxide is an extremely toxic substance, which reacts with atmospheric moisture to form sulfuric acid which is extremely corrosive and dangerous. Thus, when using sulfur trioxide extreme care must be taken to prevent contact with human skin. Furthermore, sulfur trioxide reacts violently with certain organic materials producing heat, which results in an additional hazard to users of the process. The dangerous nature of sulfur trioxide results in an increase in the time, cost and equipment required to use this process.

SUMMARY OF THE INVENTION

The present invention is directed to a method of treating plastic surfaces composed of polymeric materials to improve adhesion of a metal coating deposited upon said surfaces from electroless plating bath, said method, comprising exposing said surfaces to an atmosphere comprising an effective amount of ozone, and thereafter contacting said surfaces with an effective amount of a solvent. Polymer materials treated in accordance with the process of this invention are especially useful as the polymeric substrate in electroless plating processes. Such materials can be electroless plated immediately after pretreatment or at any time after pretreatment to provide metal coated plastic surfaces having exceptionally high peel strengths as compared to metal coated plastic surfaces in which the polymeric substrate has not been pre-treated. Following the electroless plating procedure additional metal can be plated onto the resulting metal plated surfaces through use of electroplating techniques.

Such materials which have been pretreated and metal plated in accordance with this invention are useful for many purposes. For example, such metal plated plastics can be used for decorative purposes and/or for protection. Such metal plated plastics can also be used in the manufacture of printed circuit boards and to increase the strength and surface conductance of plastics. The process of this invention also provides parts which are considerably lighter than solid metal parts, yet which still possess metal conductive properties and metal surface characteristics and other like metal characteristics.

DETAILED DESCRIPTION OF THE INVENTION

The process of this invention includes two essential steps. In the first essential, the surfaces of the plastic material to be pretreated are exposed to an atmosphere containing an "effective amount of ozone". As used herein, an "effective amount of ozone" is an amount of ozone which when contacted with the surfaces of a plastic material is effective to condition such surfaces such that subsequent treatment of said surfaces with an "effective amount of a conditioning solvent" (as hereinafter defined) followed by electroless plating of a metal thereon will provide a metal coating having enhanced peel strength as compared to the peel strength of metal coated onto untreated surfaces. While not intended to limit the scope of the invention anyway, it is believed that the ozone functions to etch the treated surfaces and render them hydrophilic. Normally, the greater the weight percent of ozone in the exposing atmosphere, the greater the degree of etching and the greater the increase in the hydrophilic character of the treated surfaces. Conversely, the less the amount of ozone in the exposing atmosphere, the less the degree of etching and the less the increase in the hydrophilic character of the treated surfaces. The quantity of ozone employed in a particular situation will depend on a number of factors, as for example the exposing temperature, the susceptibility of the particular plastic material to attack by ozone and the duration of exposure. Thus, variations in these parameters can greatly increase or decrease the speed and/or degree of etching and the extent to which the hydrophilic character of the plastic surfaces are modified; and thus, smaller or larger quantities of ozone can be employed depending on whether these operational parameters are maximized or minimized. In general, however, when employing preferred operational parameters, good results are achieved when the quantity of ozone is at least about 0.1 weight percent based on the total weight of gases in the exposing atmosphere surrounding the plastic surfaces being conditioned. In the preferred embodiments of this invention, the quantity of ozone which is employed is at least about 0.5 weight percent based on the total weight of gases in the atmosphere, and in the particularly preferred embodiments of this invention, the quantity of ozone is at least about 0.8 on the same basis. Amongst these particularly preferred embodiments, those in which the quantity of ozone is at least about 1.5 weight percent based on the total weight of gases are most preferred.

The upper weight percent of ozone is not critical, and best results would be achieved if an atmosphere composed of 100% ozone is employed. However, due to the economics of ozone generation and/or the difficulty inherent in the generation of atmospheres composed of more than about 30 weight percent ozone, atmosphere composed predominantly of ozone are normally not used.

As is apparent from the foregoing, the ozone containing atmosphere is not 100% ozone and will most often include one or more inert carrier gases, preferably this carrier gas is oxygen. However, other gases may also be used for this purpose including air, nitrogen, carbon dioxide, noble gases, mixtures of the foregoing gases and other gases which meet the requirement of non-reactivity with ozone.

Process temperatures are not critical and can be varied widely as desired, provided that the temperature is low enough to prevent substantial degradation of the plastic material being conditioned and is high enough to allow the etching process to occur. As is indicated above there is a relationship between exposure times, exposure temperatures and the quantity of ozone in the exposing atmosphere. Thus, the higher the exposure temperature, the shorter the exposure times and the smaller the quantity of ozone required to provide acceptable results, and; conversely when lower temperatures are employed, longer exposure times and larger quantities of ozone may be required. When operating under preferred conditions, the process can be conveniently carried out at a temperature as low as about −30° C. and lower, and up to a temperature of about 150° and higher, depending on the particular plastic material being etched. The process is usually carried out at a temperature of between about 15° C. and about 90° C., and preferably from about 15° C. to about 40° C., mainly for convenience of operation.

Process pressures are also not critical and can be varied widely. The process can be carried out at sub-atmospheric, atmospheric or super-atmospheric pressure. However, the process is usually conducted at atmospheric or autogenous pressure for convenience.

In the first step of the process of this invention, the plastic material is exposed to the ozone atmosphere for a time sufficient to etch the surfaces of such material and to render them hydrophilic such that on subsequent treatment with strong base and electroless plating of metal thereon, the adhesion of the metal coating is improved to the extent desired. As was noted hereinabove, the duration of exposure will depend on a number of factors including, exposure temperatures and the quantity of ozone in the exposing atmosphere. Exposure times are not critical and can be varied over a wide range as desired provided that the aforementioned result is obtained. For example, exposure times can vary from about a few seconds up to about 24 hours or more. In most instances, however, exposure times will vary from 1 to 5 seconds up to about 1 to 2 hours under the preferred process conditions, and these exposure times represent the preferred range of exposure times.

It should be appreciated that the preferred exposure time, exposure temperature and concentration of ozone in the exposing atmosphere for any particular application will depend on the type of plastic material being subjected to the process of this invention. Thus, the preferred set of process parameters for any particular application will preferably be selected in accordance with the chemical structure and reactivity of the plastic material in such a manner that optimum etching of the surface and changes in the hydrophilic character of the surface for a particular purpose is provided.

The plastic material selected for use in the process of this invention should contain functional groups which are susceptible to reaction with ozone, preferably those containing one or more unsaturated chemical bonds. Such materials include naturally occuring polymers, and plastics and other synthetic polymeric materials which may be thermoplastic, thermosetting and elastomeric polymers.

Illustrative of useful thermoplastic polymers are polyolefins, such as high or low density polyethylene, polypropylene, polyfluoroethylene, ethylene-propylene copolymers and the like; polyvinyl chloride and copolymers thereof, polyvinyl acetate, and the like; polysulfones; polystyrenes and acrylonitrilebutadiene-styrene copolymers and the like; polyamides, such as poly(hexamethylene adipamide), polycaprolactam, poly(hexamethylene sebacamide), poly(undecamide), and the like; saturated polyesters, such as poly(ethyleneglycol terephthalate), poly(butylene glycol terephthalate), and the like; polycarbonates; polyacetals; polyacrylic polymers, such as poly(methacrylate); polyacrylate acid, polyacrylonitrile, and the like; cellulose esters; and polyurethanes or polyamideimides. Exemplary of useful thermosetting polymers suitable for use in this invention are phenolic resins; aminoplastic; unsaturated polyesters; polyepoxides, and polyimides; and illustrative of useful elastomers are natural or synthetic rubbers, silicone rubbers, polyurethane elastomers and the like.

Preferred for use in the process of this invention are polymers containing carbon/oxygen double bonds, carbon/carbon triple bonds and carbon/carbon double bonds. Illustrative of such polymers are such as Nylon 66 (poly(hexamethylene adipamide)), Nylon 6 (polycaprolactam) and the like; polyacetylenes; polyisoprene; butadiene/styrene copolymer; polychloroprene; unsaturated polyesters; ABS (a block copolymer of acrylonitrile, butadiene and styrene); polybutadiene; and polyesters, such as poly(ethylene terephthalate). Particularly preferred for use in the process of this invention are homo-polymers and, random, block and/or graft copolymers which include recurring carbon/carbon double bonds such as acrylonitrile-butadiene-styrene copolymers, polybutadiene, polyisoprene, butadiene/styrene copolymer, unsaturated polyesters, and like plastics having carbon/carbon double bonds in the polymer chain.

The method of producing the ozone containing atmosphere employed in the process of the present invention is not critical and conventional procedures may be employed. For example, the ozone component can be generated from air, providing a useful atmosphere composed of ozone and air. Ozone generators are commercially available in differing sizes from small laboratory models to very large ones used in water treatment. Any of these conventional types of generators can be employed in the practice of this invention. Ozone generators are especially useful in the conduct of the process of this invention in that they are easily turned on and off to generate ozone as required and thus, their use can prevent the generation of large quantities of excess ozone. Even though ozone has no reported long term toxic effects and can be detected by smell at concentrations as low as 0.1 ppm it is generally advisable not to produce large excesses of any chemical. In the event that large excesses are produced, the unused ozone can be catalytically reduced to oxygen with alumina to prevent any potential pollution problems.

In the second essential step of the process of this invention, the treated plastic surfaces are contacted with an "effective amount of a conditioning solvent". As used herein, an "effective amount of a conditioning solvent" is an amount of a solvent which when contacted with a plastic surface previously exposed to an effective amount of ozone is capable of removing the ozone/plastic degradation products from the ozone contacted surface to provide a treated surface on which a metal coating having improved peel strength can be deposited by conventional electroless plating techniques. Illustrative of useful conditioning solvents are solutions of "strong bases." As used herein "strong base" is a base which can form an aqueous solution having a pH of at least about 8, and preferably at least about 10. Exemplary of useful strong base solutions are solutions of alkali and alkaline earth metal hydroxides and alkoxides as for example, sodium hydroxide, potassium hydroxide, lithium hydroxide, sodium methoxide, sodium ethoxide in a solvent which can solvate the base and which is not reactive with such bases. Illustrative of useful nonreactive solvents are water and polar organic solvents such as ethyl acetate, ethanol, methanol, dimethyl formamide, dimethyl sulfoxide and the like. In the particularly preferred embodiments of this invention, an aqueous solution of a strong inorganic base as for example, sodium hydroxide, lithium hydroxide, potassium hydroxide, ammonium hydroxide and the like is employed. The concentration of base in the solvent is preferably at least about 0.1 weight percent, and in the particularly preferred embodiments is in the range of from about 2 to about 30 weight percent based on the total weight of the solvent. Amongst these particularly preferred embodiments, solutions having a base content of from about 5 to about 10 weight percent on the same basis are most preferred.

After being subjected to the process of this invention, the metal surfaces are preferably washed with water to remove any conditioning solvent adhering to the treated plastic surfaces. The surfaces can then be electroless plated, which may be followed by electro plating, by conventional means to provide polymeric materials and polymeric articles having uniform and well adhering copper, brass, cadmium, chromium, nickel, gold, platinum, zinc and like metal surface layers.

Polymeric materials treated in accordance with the process of this invention followed by conventional electroless plating, and optionally by electroplating, have many uses. For example, such plated surfaces can be used for decorative purposes. The metal surfaces also provide a protective covering against abrasion and the like. In addition, plastic materials metal plated in accordance with the process of this invention can be used in the manufacture of printed circuit boards. Such boards are flat plastic plates plated with metals such as copper and the like through use of conventional techniques.

EXAMPLES I TO XV

Plaques, 2"×4"×0.080", composed of acrylonitrile/butadiene/styrene copolymer, are placed into a 2 liter glass resin kettle, fitted with gas inlet and outlet orifices. Fitted to the gas inlet orifices is an ozone generator, manufactured by the Welsbach Corporation and sold under the Tradename Welsbach Laboratory Ozonator, Model T-23. A mixture containing about 2 weight percent ozone and the remainder oxygen is generated by the ozone generator and is fed at the rate of about 0.06 ft$^3$/min. into the resin kettle. Each plaque is exposed to the ozone atmosphere at varying temperatures for varying time periods. After exposure, each plaque is removed and some are subjected to treatment with approximately 1 weight percent aqueous sodium hydroxide solution.

The process parameters, and results of each experiment are set forth in the following TABLE I.

TABLE I

| | TREATMENT OF ABS (Acrylonitrile, Butadine Styrene Copolymer | | | |
|---|---|---|---|---|
| Example | Detergent Wash Before Etching | NaOH Treatment After Etching | Duration of Ozone Treatment (mins) | Temp. °C. |
| I | Yes | Yes | 120 | 25 |
| II | Yes | Yes | 2 | 70 |
| III | No | Yes | 2 | 70 |
| IV | Yes | Yes | 5 | 70 |
| V | No | Yes | 5 | 70 |
| VI | Yes | Yes | 7 | 70 |
| VII | Yes | Yes | 10 | 70 |
| VIII | Yes | Yes | 2 | 80 |
| IX | No | Yes | 2 | 80 |
| X | Yes | Yes | 5 | 80 |
| XI | No | Yes | 5 | 80 |

TABLE I-continued
TREATMENT OF ABS (Acrylonitrile, Butadine Styrene Copolymer

| Example | Detergent Wash Before Etching | NaOH Treatment After Etching | Duration of Ozone Treatment (mins) | Temp. °C. |
|---|---|---|---|---|
| XII | Yes | Yes | 7 | 80 |
| XIII | Yes | Yes | 10 | 80 |
| XIV | Yes | Yes | 15 | 80 |

EXAMPLES XV TO XXVIII

Each of the plaques pretreated in Examples I to XIV is electroless plated as follows.

The plaque is dipped in an activator solution of (Macuplex Activator D-34, from MacDermid Inc.) (aqueous solution containing palladium, stannous, stannic, and hydrogen chloride) at 28° C. for 2 minutes and rinsed for 1 minute in water. It is then dipped in an accelerator solution of HCl, stannic chloride and water (Macuplex D-45 Accelerator, MacDermid Inc.) at 50° C. and again rinsed in water for 1 minute. Each plaque is then placed in an electroless nickel plating bath. The nickel plating bath is prepared by mixing 440 ml of Enplate Ni-414A (Enthone Inc.) with 8 liters of DI water and then adding slowly 400 mL of Enplate Ni-414B (Enthone Inc.) solution with stirring. The resulting solution contains nickel chloride or nickel sulfide, ammonium hydroxide, sodium hypophosphite and water. The pH of the solution is adjusted to about 8.8–9 with ammonium hydroxide. The plaque is dipped in this bath for 7 to 10 minutes at room temperature followed by a 1 minute wash with water. The plaque is then fixed on a plating rack, dipped into a 5% $H_2SO_4$ solution and without rinsing is placed into a copper plating bath. The copper plating bath is prepared as follows: Anhydrous $CuSO_4$ (7.5 kg) are dissolved in 45 L of distilled water. To the solution is added 1775 mL of concentrated $H_2SO_4$ followed by 16 mL of concentrated HCl. To this solution is then added sequentially a mixture of 300 mL of Enthrobite Cu 10256W (Enthone Inc), 300 mL of water, 150 mL of Enthrobite Cu 10256 B (Enthone Inc), 10 mL of 10256 L (Enthone Inc) in 2 liters of water, and 25 mL 10256S (Enthone Inc). The plaque is plated at a current density of 0.03–0.05 amp per $cm^2$ for about 90 minutes. During electroless plating, the solution is circulated using a Sethco pump equipped with a filter.

After electroless plating each plaque employing the above described procedure, the peel strength of each metal coating was evaluated and the results are as set forth in the following Table II.

TABLE II

| Example | Treated Plaque | Peel Strength (lbs./in.) |
|---|---|---|
| XV | I | 8.0 |
| XVI | II | 2.5 |
| XVII | III | 2.0 |
| XVIII | IV | 4.0 |
| XIX | V | 2.0 |
| XX | VI | 4.0 |
| XXI | VII | 4.5 |
| XXII | VIII | 2.0 |
| XXIII | IX | 4.0 |
| XXIV | X | 5.25 |
| XXV | XI | 1.75 |
| XXVI | XII | 4.5 |
| XXVII | XIII | 5.25 |
| XXVIII | XIV | 5.5 |

EXAMPLE XXIX

A plaque composed of acrylonitrile butadienestyrene copolymer was etched by the conventional technique by treating the plaque with a chromic acid solution for about 7 minutes at a temperature of 63° C. The plaque was then rinsed with DI water and placed in a neutralizer solution at 49° C. for 2 minutes. The plaque was again rinsed with DI water and was plated in accordance with the procedure of EXAMPLES XV TO XXVIII, and the peel strength of the metal coating was about 6 to about 7.5 lbs/in.

EXAMPLE XXX

A series of experiments were conducted to more particularly illustrate the criticality of treating the polymeric material with base after treatment with ozone. In these experiments, four plaques composed of ABS plastic were exposed to an atmosphere containing 1 weight percent ozone at 70° C. for ten minutes. After various treatments, each plaque was electroless plated in accordance with the procedure of EXAMPLES XV to XXVIII. The procedures employed in each treatment and the plating and peel strength of each plaque are set forth in the following TABLE III.

TABLE III

| PLAQUE NUMBER | TREATMENT AFTER ETCHING | PLATING AND PEEL STRENGTH (lb/inch) |
|---|---|---|
| 1 | No Treatment | No electroplating |
| 2 | Washed with water | No electroplating |
| 3 | Washed with 1% HCl | No electroplating |
| 4 | Washed with 1% NaOH | Excellent electroplating peel strength 5.0 lb/in. |

EXAMPLE XXX

With appropriate selection of plastic materials and other process parameters, a wide variety of such materials are treated and electroplated in accordance with the process of this invention to provide metal plated surfaces having enhanced peel strength. The process parameters of these illustrative embodiments are set forth in the following TABLE IV.

TABLE IV

| Plastic Material | Weight Percent[1] Base | Duration of Ozone Treatment (Mins.) | Weight Percent of Ozone | Temp. °C. | Peal Strength |
|---|---|---|---|---|---|
| polyethylene | .1% NaOH | 5 | 30.0 | 100 | Acceptable |
| polychloroprene | .5% KOH | 20 | 1.0 | 25 | Acceptable |
| polypropylene | 10% $NH_4OH$ | 90 | 2.0 | 60 | Acceptable |
| polyisoprene | 20% LiOH | 180 | 3.5 | 50 | Acceptable |
| polyvinyl chloride | 10% NaOH | 15 | .6 | 40 | Acceptable |

TABLE IV-continued

| Plastic Material | Weight Percent[1] Base | Duration of Ozone Treatment (Mins.) | Weight Percent of Ozone | Temp. °C. | Peal Strength |
|---|---|---|---|---|---|
| butadiene/styrene copolymer | 5% KOH | 200 | .8 | 85 | Acceptable |
| polycaprolactam | 30% LiOH | 240 | 1.0 | 100 | Acceptable |
| poly(undecamide) | 5% NH4OH | 360 | .15 | 15 | Acceptable |
| polybutadiene | 25% NaOH | 10 | 2.2 | 25 | Acceptable |
| ABS | 15% KOH | 15 | 3.8 | 40 | Acceptable |
| polybutadiene | 2% NaOH | 90 | 3.5 | 85 | Acceptable |
| ABS | 19% NH4OH | 600 | .05 | 00 | Acceptable |
| polyacetylene | 25% NaOH | 100 | .8 | 90 | Acceptable |
| ABS | 35% KOH | 120 | .9 | 110 | Acceptable |
| polyisoprene | 30% NH4OH | 150 | 1.0 | 120 | Acceptable |
| polychloroprene | 25% KOH | 100 | 3.0 | 15 | Acceptable |
| acrylonitrile/butadiene copolymer | 1% NaOH | 50 | 4.5 | 0 | Acceptable |
| ABS | 8% NaOH | 90 | 3.2 | 5 | Acceptable |
| polybutadiene | 2% KOH | 120 | 4.0 | 65 | Acceptable |

[1] The remainder of the solution is water.

The foregoing detailed description of the invention has been given for clearness of understanding only, and no unnecessary limitations are to be understood therefrom. The invention is not limited to the exact details herein shown and described, and will encompass obvious modifications which will occur to those of skill in the art in light of the appended claims.

What is claimed is:

1. In an improved process for metal plating a natural or synthetic plastic material by conditioning said material to improve metal adhesion and depositing a metal coating upon said conditioned surface from an electroless plating bath, wherein said improvement comprises a conditioning step in which said material is exposed to an atmosphere comprising an effective amount of ozone and is then contacted with an effective amount of one or more strong organic or inorganic bases.

2. An improved process according to claim 1 wherein said material is selected from the group consisting of polymers containing carbon-carbon unsaturation within the polymer chain.

3. An improved process according to claim 2 wherein said material is a plastic selected from the group consisting of block and graft copolymers in which at least one type of the recurring monomeric units of said plastic includes carbon/carbon unsaturation.

4. An improved process according to claim 2 wherein said plastic comprises three types of recurring monomeric units, one of which includes a carbon/carbon double bond.

5. An improved process according to claim 2 wherein said plastic is acrylonitrile-butadiene-styrene copolymer.

6. A composition according to claim 1 wherein said material comprises a mixture of polymers at least one of which contains carbon-carbon unsaturation in the polymer chain.

7. An improved process according to claim 2 or 3 or 4 wherein said carbon/carbon unsaturation is a double bond.

8. An improved process according to claim 7 wherein said material is selected from the group consisting of polybutadiene, butadiene/styrene copolymer, butadiene/acrylonitrile copolymer, polychloroprene, polyisoprene and acrylonitrile-butadiene-styrene copolymer.

9. An improved process according to claim 1 or 4 wherein the quantity of ozone in said atmosphere is at least about 0.1 weight percent based on the total weight of the atmosphere.

10. An improved process according to claim 9 wherein said quantity is at least about 0.5 weight percent.

11. An improved process according to claim 10 wherein said quantity is at least about 0.8 weight percent.

12. An improved process according to claim 11 wherein said quantity is at least about 1.5 weight percent.

13. An improved process according to claim 1 wherein said bases are selected from the group consisting of strong inorganic bases.

14. An improved process according to claim 13 wherein said exposed material is contacted with an aqueous solution containing an effective amount of said strong inorganic base.

15. An improved process according to claim 14 wherein said base is selected from the group consisting of sodium hydroxide, lithium hydroxide, potassium hydroxide and ammonium hydroxide.

16. An improved process according to claim 1 wherein the concentration of base in said solution is at least about 0.5 weight percent based on the total weight of the solution.

17. An improved process according to claim 16 wherein said concentration is from about 0.5 to about 30 weight percent.

18. An improved process according to claim 17 wherein said concentration is from about 2 to about 30 weight percent.

19. An improved process according to claim 18 wherein said concentration is from about 5 to about 10 weight percent.

20. An improved process for plating one or more metals onto the surfaces of a plastic material which comprises:
(a) exposing said material to an atmosphere containing an effective amount of ozone;
(b) contacting said exposed material with an effective amount of one or more strong organic or inorganic bases;
(c) coating said contacted material with a catalyst for electroless plating of metal thereon; and
(d) depositing a metal coating on said catalyzed material by electroless plating.

21. An improved process according to claim 20 wherein said metal is selected from the group consisting of copper, nickel and cobalt.

22. An improved process according to claim 20 which further comprises depositing one or more additional metal coatings onto said metal coated material of step d, by electroplating.

23. An improved process according to claim 22 wherein said one or more additional metals are selected from the group consisting of copper, nickel and chromium.

* * * * *